US012566435B2

(12) United States Patent　　　(10) Patent No.:　US 12,566,435 B2
Soleyman et al.　　　　　　　　(45) Date of Patent:　　Mar. 3, 2026

(54) PREDICTIVE MODELING OF AIRCRAFT DYNAMICS

(71) Applicant: The Boeing Company, Chicago, IL (US)

(72) Inventors: Sean Soleyman, Calabasas, CA (US); Yang Chen, Westlake Village, CA (US); Fan Hin Hung, Los Angeles, CA (US); Deepak Khosla, Camarillo, CA (US); Navid Naderializadeh, Woodland Hills, CA (US)

(73) Assignee: The Boeing Company, Chicago, IL (US)

( * ) Notice: Subject to any disclaimer, the term of this patent is extended or adjusted under 35 U.S.C. 154(b) by 831 days.

(21) Appl. No.: 17/655,455

(22) Filed: Mar. 18, 2022

(65) Prior Publication Data

US 2022/0414422 A1　　Dec. 29, 2022

Related U.S. Application Data

(60) Provisional application No. 63/202,768, filed on Jun. 23, 2021.

(51) Int. Cl.
*G05D 1/00*　　　　(2024.01)
*B64F 5/60*　　　　(2017.01)
　　　(Continued)

(52) U.S. Cl.
CPC ............. *G05D 1/0088* (2013.01); *B64F 5/60* (2017.01); *G05B 13/027* (2013.01);
　　　(Continued)

(58) Field of Classification Search
CPC ...... G05D 1/0088; G05D 1/1064; B64F 5/60; G06F 30/15; G06F 30/27; G06N 3/04; G06N 3/044; G06N 3/08; G06N 3/048
See application file for complete search history.

(56) References Cited

U.S. PATENT DOCUMENTS 6,466,888 B1　10/2002　McCool et al.
11,195,097 B2 *　12/2021　Baker ..................... G06N 3/045
　　　　　(Continued)

FOREIGN PATENT DOCUMENTS

CN　　　　1471451 A　　1/2004
CN　　107530743 A　　1/2018
　　　　　(Continued)

OTHER PUBLICATIONS

Ha et al., "World Models," 2018 Conference on Neural Information Processing Systems, Dec. 3-8, 2018, arXiv:1803.10122v4, 21 pages.
　　　　　(Continued)

*Primary Examiner* — David P. Merlino

*Assistant Examiner* — Mahmoud M Kazimi

(74) *Attorney, Agent, or Firm* — Yee & Associates, P.C.

(57)　　　　ABSTRACT

A computer-implemented method for predicting behavior of aircraft is provided. The method comprises inputting a current state of a number of aircraft into a number of hidden layers of a neural network, wherein the neural network is fully connected. An action applied to the aircraft is input into the hidden layers concurrently with the current state. The hidden layers, according to the current state and current action, determine a residual output that comprises an incremental difference in the state of the aircraft resulting from the current action. A skip connection feeds forward the current state of the aircraft, and the residual output is added to the current state to determine a next state of the aircraft.

20 Claims, 13 Drawing Sheets

(51) Int. Cl.

| | |
|---|---|
| *G05B 13/02* | (2006.01) |
| *G05D 1/617* | (2024.01) |
| *G05D 101/15* | (2024.01) |
| *G06F 30/15* | (2020.01) |
| *G06F 30/27* | (2020.01) |
| *G06N 3/04* | (2023.01) |
| *G06N 3/044* | (2023.01) |
| *G06N 3/08* | (2023.01) |

(52) U.S. Cl.

CPC ........... *G05D 1/1064* (2019.05); *G05D 1/617* (2024.01); *G06F 30/15* (2020.01); *G06F 30/27* (2020.01); *G06N 3/04* (2013.01); *G06N 3/044* (2023.01); *G06N 3/08* (2013.01); *G05D 2101/15* (2024.01)

(56) References Cited

U.S. PATENT DOCUMENTS

| | | | |
|---|---|---|---|
| 11,537,134 B1 | 12/2022 | Wiest et al. | |
| 11,562,167 B2 * | 1/2023 | Yoon ................... | G06F 18/2155 |
| 2010/0304640 A1 | 12/2010 | Sofman et al. | |
| 2015/0298786 A1 | 10/2015 | Stigler et al. | |
| 2019/0359214 A1 | 11/2019 | Max et al. | |
| 2020/0021851 A1 | 1/2020 | Zhao et al. | |
| 2020/0202723 A1 | 6/2020 | Pierre et al. | |
| 2020/0272162 A1 * | 8/2020 | Hasselgren .......... | G05D 1/0231 |
| 2021/0048817 A1 | 2/2021 | Olson et al. | |
| 2021/0049460 A1 * | 2/2021 | Ahn ........................ | G06N 3/047 |
| 2021/0081843 A1 * | 3/2021 | Banijamali ............ | G06N 3/088 |
| 2021/0179121 A1 | 6/2021 | Lopez et al. | |
| 2022/0156576 A1 | 5/2022 | Rasouli et al. | |
| 2022/0230376 A1 | 7/2022 | Rozantsev et al. | |
| 2022/0254259 A1 * | 8/2022 | Martinez ................. | G08G 5/30 |
| 2022/0413496 A1 | 12/2022 | Soleyman et al. | |
| 2022/0414283 A1 | 12/2022 | Soleyman et al. | |
| 2022/0414460 A1 | 12/2022 | Soleyman et al. | |

FOREIGN PATENT DOCUMENTS

| | | |
|---|---|---|
| CN | 111318971 A | 6/2020 |
| EP | 3450103 A1 | 3/2019 |
| JP | H11123586 A | 5/1999 |
| WO | 2002049900 A1 | 6/2002 |

OTHER PUBLICATIONS

James et al., "Longitudinal Vehicle Dynamics: A Comparison of Physical and Data-Driven Models Under Large-Scale Real-World Driving Conditions," IEEE Access, vol. 8, Apr. 17, 2020, 16 pages.
He et al., "Deep Residual Learning for Image Recognition," Dec. 10, 2015, arXiv:1512.03385v1, 12 pages.
He et al., "Identity Mappings in Deep Residual Networks," Jul. 25, 2016, arXiv:1603.05027v3, 15 pages.
Yim et al., "Modeling of Vehicle Dynamics From Real Vehicle Measurements Using a Neural Network With Two-Stage Hybrid Learning for Accurate Long-Term Prediction," IEEE Transactions on Vehicular Technology, vol. 53, No. 4, Jul. 2004, 9 pages.
Office Action, dated Feb. 3, 2025, regarding U.S. Appl. No. 17/655,468, 32 pages.
Office Action, dated Mar. 12, 2025, regarding U.S. Appl. No. 17/655,473, 22 pages.
Notice of Allowance, dated May 29, 2025, regarding U.S. Appl. No. 17/655,473, 7 pages.
Final Office Action, dated Jun. 13, 2025, regarding U.S. Appl. No. 17/655,468, 45 pages.
Final Office Action, dated Apr. 29, 2025, regarding U.S. Appl. No. 17/655,473, 14 pages.
Office Action, dated Aug. 6, 2025, regarding U.S. Appl. No. 17/655,461, 57 pages.
China National Intellectual Property Administration Office Action Search Report, dated Sep. 3, 2025, regarding CNIPA Application No. 2021115148567.
Final Office Action, dated Sep. 22, 2025, regarding U.S. Appl. No. 17/655,461, 28 pages.
Azayev, T., Deep Learning for Autonomous Control of Robot's Flippers in Simulation, Retrieved from Internet: <https://core.ac.uk/download/pdf/151072651.pdf> (Year: 2017).
Office Action, dated Oct. 16, 2025, regarding U.S. Appl. No. 17/655,468, 43 pages.

* cited by examiner

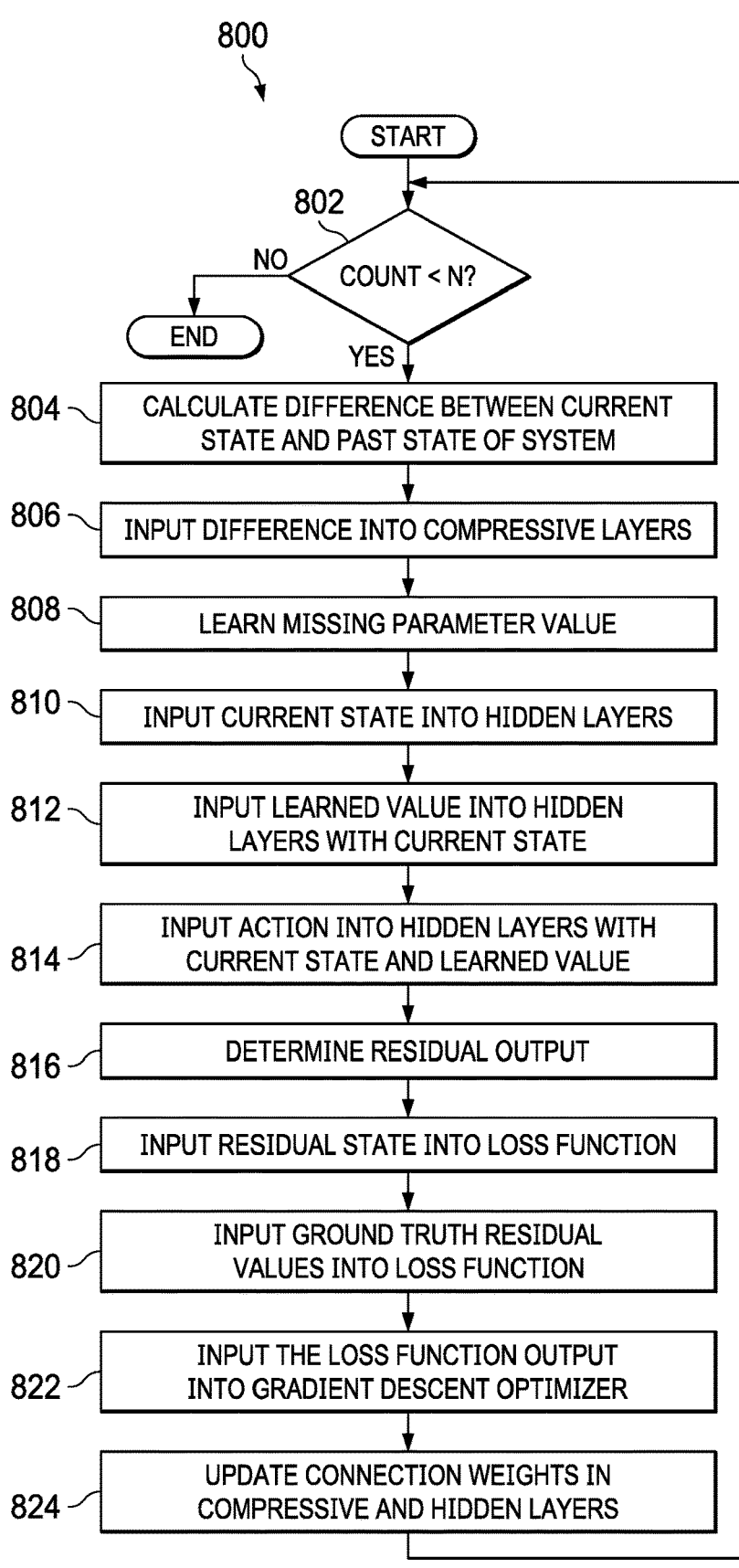

800

START

802

COUNT < N?

NO

END

YES

804 — CALCULATE DIFFERENCE BETWEEN CURRENT STATE AND PAST STATE OF SYSTEM

806 — INPUT DIFFERENCE INTO COMPRESSIVE LAYERS

808 — LEARN MISSING PARAMETER VALUE

810 — INPUT CURRENT STATE INTO HIDDEN LAYERS

812 — INPUT LEARNED VALUE INTO HIDDEN LAYERS WITH CURRENT STATE

814 — INPUT ACTION INTO HIDDEN LAYERS WITH CURRENT STATE AND LEARNED VALUE

816 — DETERMINE RESIDUAL OUTPUT

818 — INPUT RESIDUAL STATE INTO LOSS FUNCTION

820 — INPUT GROUND TRUTH RESIDUAL VALUES INTO LOSS FUNCTION

822 — INPUT THE LOSS FUNCTION OUTPUT INTO GRADIENT DESCENT OPTIMIZER

824 — UPDATE CONNECTION WEIGHTS IN COMPRESSIVE AND HIDDEN LAYERS

FIG. 8

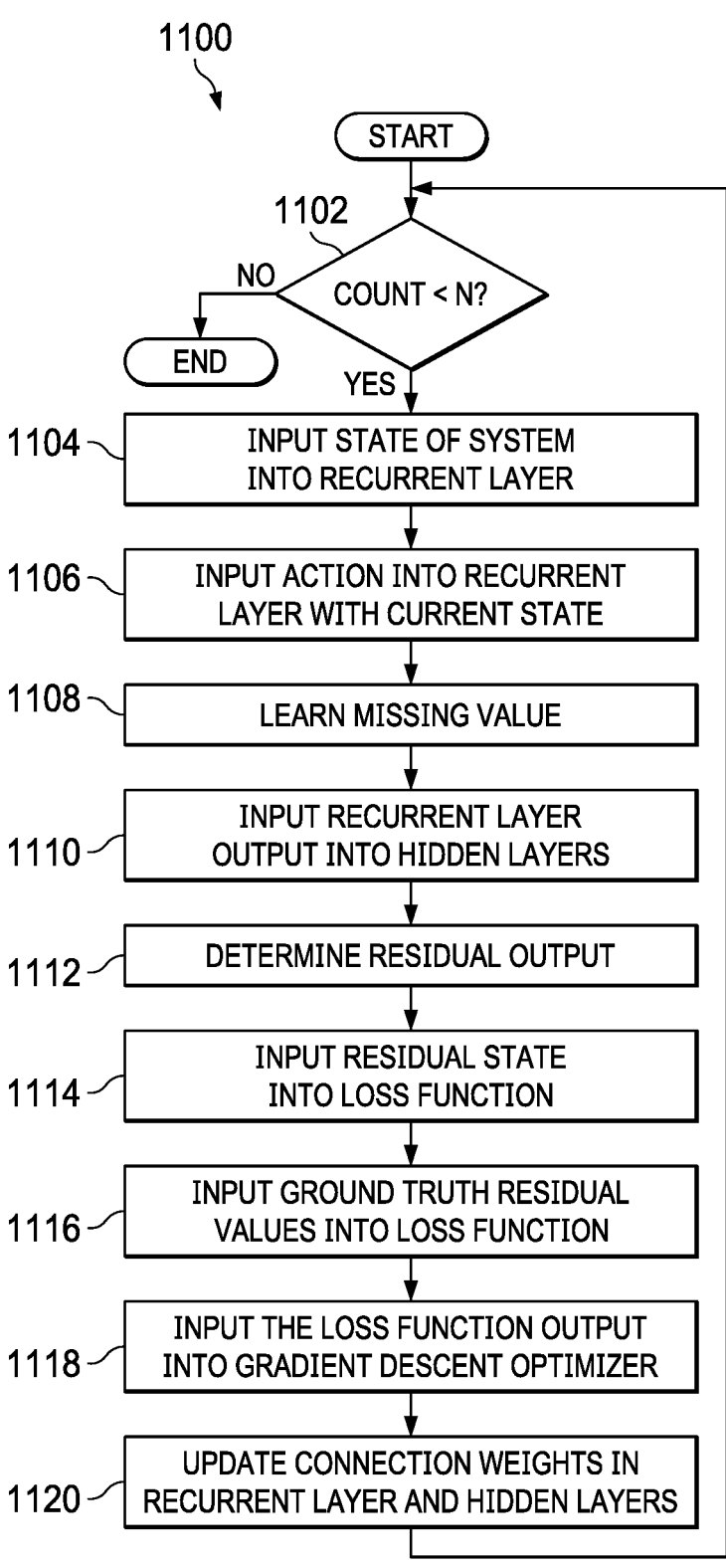

1100

START

1102 COUNT < N?

NO

END

YES

1104 — INPUT STATE OF SYSTEM INTO RECURRENT LAYER

1106 — INPUT ACTION INTO RECURRENT LAYER WITH CURRENT STATE

1108 — LEARN MISSING VALUE

1110 — INPUT RECURRENT LAYER OUTPUT INTO HIDDEN LAYERS

1112 — DETERMINE RESIDUAL OUTPUT

1114 — INPUT RESIDUAL STATE INTO LOSS FUNCTION

1116 — INPUT GROUND TRUTH RESIDUAL VALUES INTO LOSS FUNCTION

1118 — INPUT THE LOSS FUNCTION OUTPUT INTO GRADIENT DESCENT OPTIMIZER

1120 — UPDATE CONNECTION WEIGHTS IN RECURRENT LAYER AND HIDDEN LAYERS

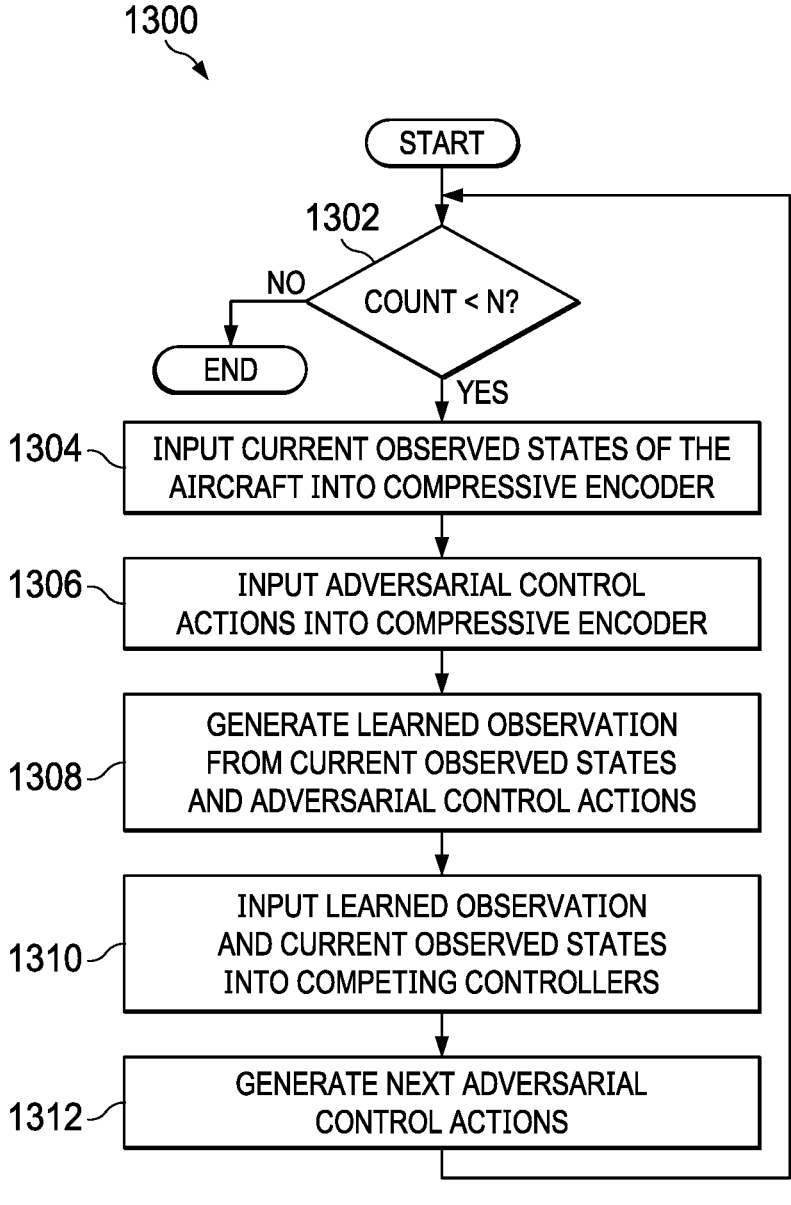

START

1302

COUNT < N?

NO

END

YES

1304 — INPUT CURRENT OBSERVED STATES OF THE AIRCRAFT INTO COMPRESSIVE ENCODER

1306 — INPUT ADVERSARIAL CONTROL ACTIONS INTO COMPRESSIVE ENCODER

1308 — GENERATE LEARNED OBSERVATION FROM CURRENT OBSERVED STATES AND ADVERSARIAL CONTROL ACTIONS

1310 — INPUT LEARNED OBSERVATION AND CURRENT OBSERVED STATES INTO COMPETING CONTROLLERS

1312 — GENERATE NEXT ADVERSARIAL CONTROL ACTIONS

FIG. 13

PREDICTIVE MODELING OF AIRCRAFT DYNAMICS

CROSS-REFERENCE TO RELATED APPLICATIONS

This application claims the benefit of U.S. Provisional Patent Application Ser. No. 63/202,768, filed Jun. 23, 2021, and entitled "Predictive Modeling of Aircraft Dynamics," which is incorporated herein by reference in its entirety.

This application is related to Co-Filed U.S. patent application Ser. No. 17/655,461, filed Mar. 18, 2022, and entitled "Predictive Modeling of Aircraft Dynamics," which is incorporated herein by reference in its entirety.

This application is related to Co-Filed U.S. patent application Ser. No. 17/655,468, filed Mar. 18, 2022, and entitled "Predictive Modeling of Aircraft Dynamics," which is incorporated herein by reference in its entirety.

This application is related to Co-Filed U.S. patent application Ser. No. 17/655,473, filed Mar. 18, 2022, and entitled "Predictive Modeling of Aircraft Dynamics," issued as U.S. Pat. No. 12,360,529 on Jul. 15, 2025, which is incorporated herein by reference in its entirety.

BACKGROUND INFORMATION

1. Field

The present disclosure relates generally to machine learning, more specifically, to a method for predictive modeling of aircraft in adversarial and cooperative scenarios.

2. Background

Aircraft can be controlled by both humans and autonomous control systems. Adversarial and cooperative scenarios involving two or more aircraft require flexible reactions to events occurring in the environment. Such events might comprise events caused by other aircraft as well as environmental events resulting from factors such as weather and terrain.

Traditional (non-learning-based) methods for predicting the future trajectory of single or multiple aircraft have used physics-based dynamic equations. This approach is not always suitable for aircraft autonomy applications because it requires a pre-existing model of the exact aircraft in question. Furthermore, the physics-based model might require state variables that are unavailable to the autonomous agent during operation.

Therefore, it would be desirable to have a method and apparatus that take into account at least some of the issues discussed above, as well as other possible issues.

SUMMARY

An illustrative embodiment provides a computer-implemented method for predicting behavior of aircraft. The method comprises inputting a current state of a number of aircraft into a number of hidden layers of a neural network, wherein the neural network is fully connected. An action applied to the aircraft is input into the hidden layers concurrently with the current state. The hidden layers, according to the current state and current action, determine a residual output that comprises an incremental difference in the state of the aircraft resulting from the current action. A skip connection feeds forward the current state of the aircraft, and the residual output is added to the current state to determine a next state of the aircraft.

Another illustrative embodiment provides a system for predicting behavior of aircraft. The system comprises a storage device configured to store program instructions and one or more processors operably connected to the storage device and configured to execute the program instructions to cause the system to: input a current state of a number of aircraft into a number of hidden layers of a neural network, wherein the neural network is fully connected; input an action applied to the aircraft into the hidden layers concurrently with the current state; determine, by the hidden layers according to the current state and current action, a residual output that comprises an incremental difference in the state of the aircraft resulting from the current action; feed forward, by a skip connection, the current state of the aircraft; and add the residual output to the current state to determine a next state of the aircraft.

Another illustrative embodiment provides a computer program product for predicting behavior of aircraft. The computer program product comprising a computer-readable storage medium having program instructions embodied thereon to perform the steps of: inputting a current state of a number of aircraft into a number of hidden layers of a neural network, wherein the neural network is fully connected; inputting an action applied to the aircraft into the hidden layers concurrently with the current state; determining, by the hidden layers according to the current state and current action, a residual output that comprises an incremental difference in the state of the aircraft resulting from the current action; feeding forward, by a skip connection, the current state of the aircraft; and adding the residual output to the current state to determine a next state of the aircraft.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 8 depicts a flowchart illustrating the process of training a compressive encoder for use with an aircraft controller in accordance with an illustrative embodiment;

FIG. 11 depicts a flowchart illustrating an alternate process of training an encoder for use with an aircraft controller in accordance with an illustrative embodiment;

FIG. 13 depicts a flowchart illustrating a process of training adversarial aircraft controllers in accordance with an illustrative embodiment.

DETAILED DESCRIPTION

The illustrative embodiments recognize and take into account one or more different considerations. The illustrative embodiments recognize and take into account that traditional (non-learning-based) methods for predicting the future trajectory of single or multiple aircraft use physics-based dynamic equations. This approach is not always suitable for aircraft autonomy applications because it requires a pre-existing model of the exact aircraft in question.

The illustrative embodiments also recognize and take into account that the physics-based model might require state variables that are unavailable to the autonomous agent during operation. Furthermore, pre-existing models may be too complex for use with certain artificial intelligence (AI) algorithms because the models contain too many variables. The illustrative embodiments recognize and take into account that in the case of such complex models it would be desirable to have an automated method for producing a compressed state representation that still enables accurate model-based predictions of future states.

The illustrative embodiments also recognize and take into account that current learning-based methods approach the above problems by using neural networks instead of physics-based equations. However, such existing models have failed to make accurate predictions that match even the simplest aircraft dynamics models. For example, the naive model is unable to learn that aircraft consistently fly in the general direction of their heading angle.

The illustrative embodiments provide a machine learning method that predicts the future trajectory of single or multiple aircraft based on current (and possible past) state observations together with the controller(s) that specify inputs to the aircraft. The illustrative embodiments employ a neural network with a feedforward skip connection from some of the inputs to all of the outputs of a deep neural network. Numerical conditioning challenges encountered during training are addressed by applying a loss function only to a residual output, excluding the skip connection. Angular variables are handled with a special residual method to prevent large changes in the absolute value of angle changes from one timestep state observation to another.

The illustrative embodiments also extend model-based reinforcement learning methods to adversarial multiagent environments. This extension is accomplished using a compressive encoding scheme that makes use of the residual skip connection and the difference between two previous observations instead of the entire observation history as input to the neural network.

Figure 1:
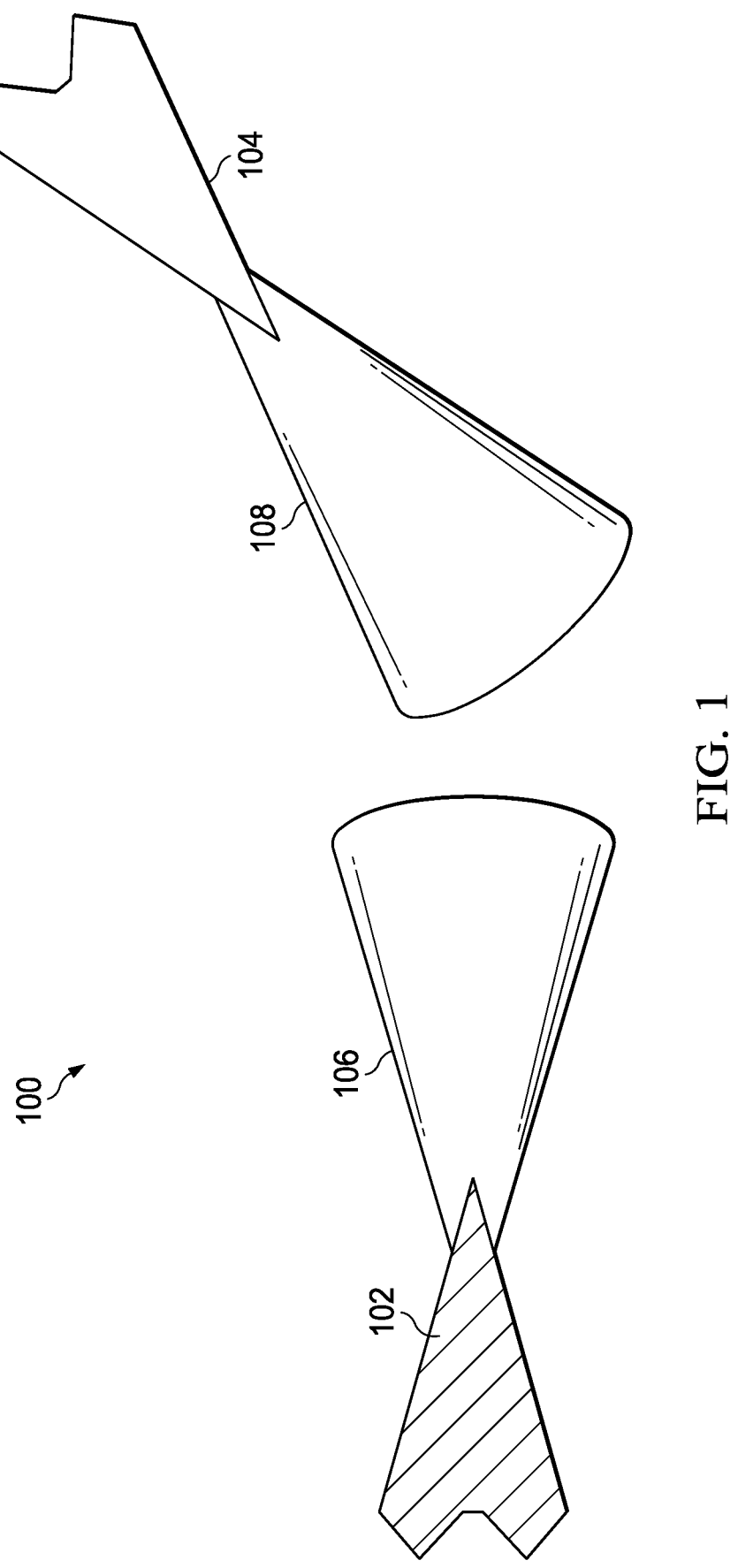
FIG. 1 depicts a diagram illustrating a multi-aircraft system with which the illustrative embodiments can be implemented.

FIG. 1 depicts a diagram illustrating a multi-aircraft system with which the illustrative embodiments can be implemented. In the context of FIG. 1, "system" refers to a physical environment that comprises a number of aircraft that may interact with each other. Such interaction might be cooperative or adversarial.

In the present example, multi-aircraft system 100 comprises two aircraft 102 and 104. Each aircraft 102, 104 has a respective sensor cone 106, 108 representing the effective area of aircraft sensor systems that may be used to detect other aircraft and possibly direct onboard weapon systems.

Figure 2:
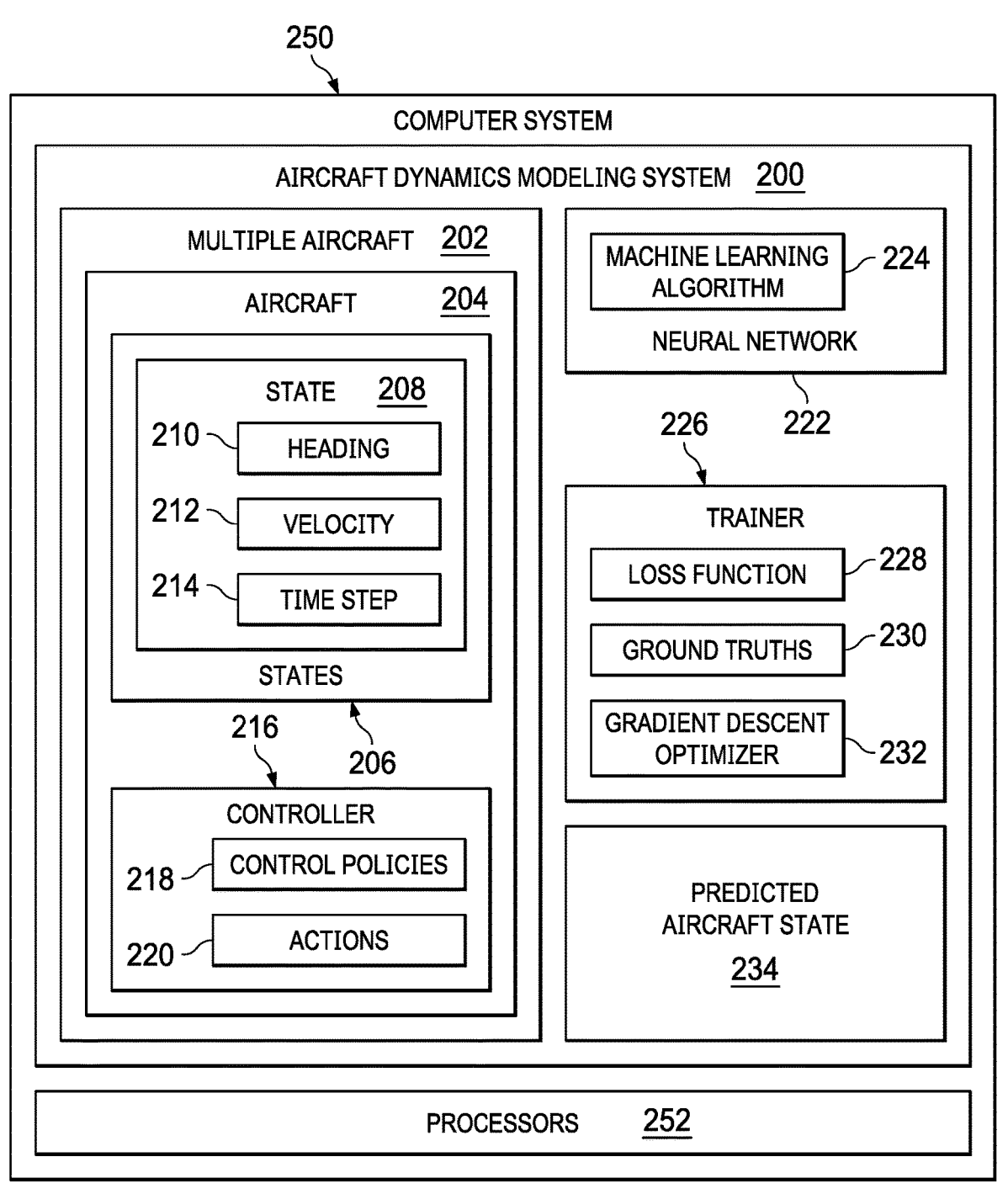
FIG. 2 is an illustration of a block diagram of an aircraft dynamics modeling system in accordance with an illustrative embodiment.

Turning now to FIG. 2, an illustration of a block diagram of an aircraft dynamics modeling system in accordance with an illustrative embodiment. Aircraft dynamics modeling system 200 may be used to model the behavior and interaction of aircraft such as aircraft 102 and 104 in FIG. 1.

Aircraft dynamics modeling system 200 comprises a model for multiple aircraft 202. Each aircraft 204 in the model comprises a number of states 206 describing the behavior of the aircraft over time. In the present example, each state 208 comprises a heading 210 and velocity 212 of the aircraft 204 at a specific time step 214.

Changes to the state of an aircraft 204 are implemented by a controller 216 that comprises a number of control policies 218 capable of generating a number of control actions 220 that can be applied to the aircraft.

Neural network 222 implements a machine learning algorithm 224 to learn and predict the expected behavior of aircraft. Given a current state and a control action applied to the aircraft, neural network 222 generates a predicted future state 234 of the aircraft.

Trainer 226 improves the accuracy of neural network 222 by applying a loss function 228 to compare the output of the neural network with empirical ground truths 230. A gradient descent optimizer 232 is able to use the product of the loss function 228 to adjust the connection weight within neural network 222 to improve the network's accuracy.

Aircraft dynamics modeling system 200 can be implemented in software, hardware, firmware, or a combination thereof. When software is used, the operations performed by aircraft dynamics modeling system 200 can be implemented in program code configured to run on hardware, such as a processor unit. When firmware is used, the operations performed by aircraft dynamics modeling system 200 can be implemented in program code and data and stored in persistent memory to run on a processor unit. When hardware is employed, the hardware may include circuits that operate to perform the operations in aircraft dynamics modeling system 200.

In the illustrative examples, the hardware may take a form selected from at least one of a circuit system, an integrated circuit, an application specific integrated circuit (ASIC), a programmable logic device, or some other suitable type of hardware configured to perform a number of operations. With a programmable logic device, the device can be configured to perform the number of operations. The device can be reconfigured at a later time or can be permanently configured to perform the number of operations. Programmable logic devices include, for example, a programmable logic array, a programmable array logic, a field programmable logic array, a field programmable gate array, and other suitable hardware devices. Additionally, the processes can be implemented in organic components integrated with inorganic components and can be comprised entirely of organic components excluding a human being. For example, the processes can be implemented as circuits in organic semiconductors.

These components for aircraft dynamics modeling system 200 can be located in computer system 250, which is a physical hardware system and includes one or more data processing systems. When more than one data processing system is present in computer system 250, those data processing systems are in communication with each other using a communications medium. The communications medium can be a network. The data processing systems can be selected from at least one of a computer, a server computer, a tablet computer, or some other suitable data processing system.

For example, aircraft dynamics modeling system 200 can run on one or more processors 252 in computer system 250. As used herein a processor is a hardware device and is comprised of hardware circuits such as those on an integrated circuit that respond and process instructions and program code that operate a computer. When processors 252 execute instructions for a process, one or more processors can be on the same computer or on different computers in computer system 250. In other words, the process can be distributed between processors 252 on the same or different computers in computer system 250. Further, one or more processors 252 can be of the same type or different type of processors 252. For example, one or more processors 252 can be selected from at least one of a single core processor, a dual-core processor, a multi-processor core, a general-purpose central processing unit (CPU), a graphics processing unit (GPU), a digital signal processor (DSP), or some other type of processor.

There are three main categories of machine learning: supervised, unsupervised, and reinforcement learning. Supervised machine learning comprises providing the machine with training data and the correct output value of the data. During supervised learning the values for the output are provided along with the training data (labeled dataset) for the model building process. The algorithm, through trial and error, deciphers the patterns that exist between the input training data and the known output values to create a model that can reproduce the same underlying rules with new data. Examples of supervised learning algorithms include regression analysis, decision trees, k-nearest neighbors, neural networks, and support vector machines.

If unsupervised learning is used, not all of the variables and data patterns are labeled, forcing the machine to discover hidden patterns and create labels on its own through the use of unsupervised learning algorithms. Unsupervised learning has the advantage of discovering patterns in the data with no need for labeled datasets. Examples of algorithms used in unsupervised machine learning include k-means clustering, association analysis, and descending clustering.

Whereas supervised and unsupervised methods learn from a dataset, reinforcement learning methods learn from feedback to re-learn/retrain the models. Algorithms are used to train the predictive model through interacting with the environment using measurable performance criteria.

Figure 3:
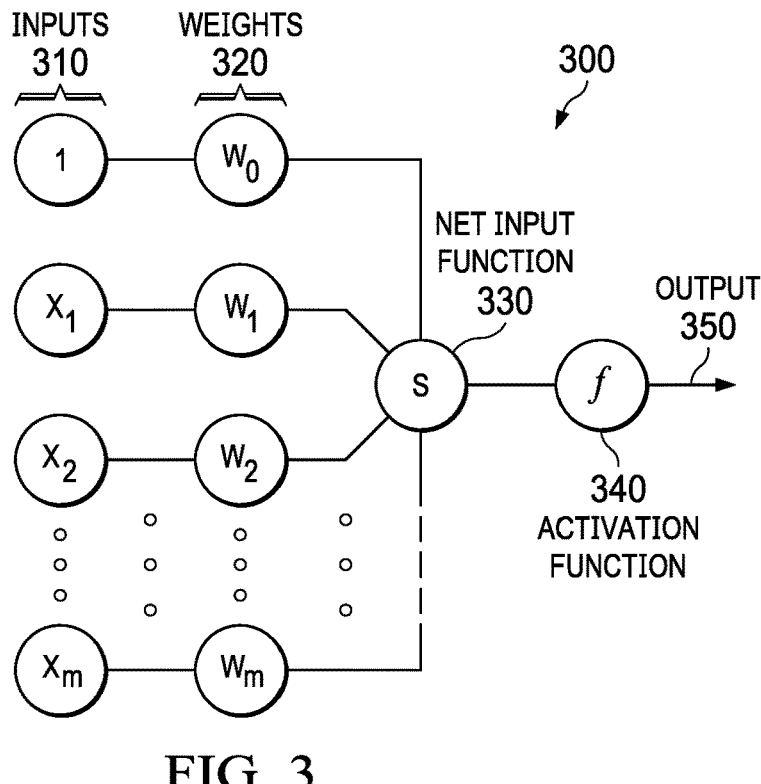
FIG. 3 is a diagram that illustrates a node in a neural network in which illustrative embodiments can be implemented.

FIG. 3 depicts a diagram illustrating a node in a neural network in which illustrative embodiments can be implemented. Node 300 combines multiple inputs 310 from other nodes. Each input 310 is multiplied by a respective weight 320 that either amplifies or dampens that input, thereby assigning significance to each input for the task the algorithm is trying to learn. The weighted inputs are collected by a net input function 330 and then passed through an activation function 340 to determine the output 350. The connections between nodes are called edges. The respective weights of nodes and edges might change as learning proceeds, increasing or decreasing the weight of the respective signals at an edge. A node might only send a signal if the aggregate input signal exceeds a predefined threshold. Pairing adjustable weights with input features is how significance is assigned to those features with regard to how the network classifies and clusters input data.

Neural networks are often aggregated into layers, with different layers performing different kinds of transformations on their respective inputs. A node layer is a row of nodes that turn on or off as input is fed through the network. Signals travel from the first (input) layer to the last (output) layer, passing through any layers in between. Each layer's output acts as the next layer's input.

Figure 4:
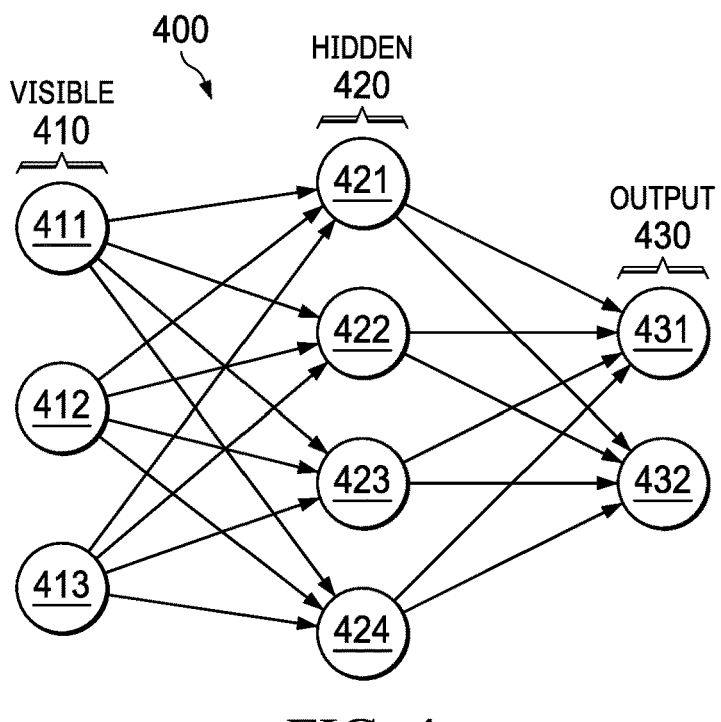
FIG. 4 is a diagram illustrating a neural network in which illustrative embodiments can be implemented.

FIG. 4 depicts a diagram illustrating a neural network in which illustrative embodiments can be implemented. As shown in FIG. 4, the nodes in the neural network 400 are divided into a layer of visible nodes 410, a layer of hidden nodes 420, and a layer of output nodes 430. The nodes in these layers might comprise nodes such as node 300 in FIG. 3. The visible nodes 410 are those that receive information from the environment (i.e., a set of external training data). Each visible node in layer 410 takes a low-level feature from an item in the dataset and passes it to the hidden nodes in the next layer 420. When a node in the hidden layer 420 receives an input value x from a visible node in layer 410 it multiplies x by the weight assigned to that connection (edge) and adds it to a bias b. The result of these two operations is then fed into an activation function which produces the node's output.

In fully connected feed-forward networks, each node in one layer is connected to every node in the next layer. For example, node 421 receives input from all of the visible nodes 411, 412, and 413 each x value from the separate nodes is multiplied by its respective weight, and all of the products are summed. The summed products are then added to the hidden layer bias, and the result is passed through the activation function to produce output to output nodes 431 and 432 in output layer 430. A similar process is repeated at hidden nodes 422, 423, and 424. In the case of a deeper neural network, the outputs of hidden layer 420 serve as inputs to the next hidden layer.

Artificial neural networks are configured to perform particular tasks by considering examples, generally without task-specific programming. The process of configuring an artificial neural network to perform a particular task may be referred to as training. An artificial neural network that is being trained to perform a particular task may be described as learning to perform the task in question.

A typical process for training an artificial neural network may include providing an input having a known desired output. The input is propagated through the neural network until an output is produced at the output layer of the network. The output is then compared to the desired output, using a loss function. The resulting error value is calculated for each of the artificial neurons (nodes) in the output layer of the neural network. The error values are then propagated from the output back through the artificial neural network, until each artificial neuron in the network has an associated error value that reflects its contribution to the original output. Backpropagation uses these error values to calculate the gradient of the loss function. This gradient is used by an optimization method to update the weights in the artificial neural network in an attempt to minimize the loss function. This process of propagation and weight update is then repeated for other inputs having known desired outputs.

An artificial neural network may be implemented as a neural network model running on conventional computer processor hardware, such as a central processor unit (CPU) and a graphical processor unit (GPU). Alternatively, an artificial neural network may be implemented on neuromorphic hardware. Neuromorphic hardware may comprise very-large-scale integration (VLSI) systems containing electronic analog circuits that mimic neuro-biological architectures present in the nervous system. Neuromorphic hardware may include analog, digital, mixed-mode analog and digital VLSI, and software systems that implement models of neural systems. Neuromorphic hardware may thus be used to implement artificial neural networks directly in hardware. An artificial neural network implemented in neuromorphic hardware may be faster and more efficient than running a neural network model on conventional computer hardware.

Training a neural network occurs in a supervised fashion with training data comprised of a set of input-output pairs, (x,y), where x is an input example and y is the desired output of the neural network corresponding to x. Training typically proceeds as follows. Each x in the training data set is input to the neural network (visible layer 410), and the neural network processes the input through the hidden layer 420 and produces an output, y' 430. This predicted output, y', is compared to the desired output y corresponding to input x from the training data set, and the error between y' and y is calculated. Using a calculus-based method known as backpropagation, the amount of each node's contribution to the prediction error is calculated, and each node's weight is adjusted to improve the neural network's prediction. Several training iterations are typically used to train the neural network to a desired level of accuracy with respect to the training data.

In machine learning, the aforementioned error is calculated via a cost function that estimates how the model is performing. It is a measure of how wrong the model is in terms of its ability to estimate the relationship between input x and output y, which is expressed as a difference or distance between the predicted value and the actual value. The cost function (i.e. loss or error) can be estimated by iteratively running the model to compare estimated predictions against known values of y during supervised learning. The objective of a machine learning model, therefore, is to find parameters, weights, or a structure that minimizes the cost function.

Gradient descent is an optimization algorithm that attempts to find a local or global minima of a function, thereby enabling the model to learn the gradient or direction that the model should take in order to reduce errors. As the model iterates, it gradually converges towards a minimum where further tweaks to the parameters produce little or zero changes in the loss. At this point the model has optimized the weights such that they minimize the cost function.

Neural network layers can be stacked to create deep networks. After training one neural net, the activities of its hidden nodes can be used as inputs for a higher level, thereby allowing stacking of neural network layers. Such stacking makes it possible to efficiently train several layers of hidden nodes. Examples of stacked networks include deep belief networks (DBN), convolutional neural networks (CNN), and recurrent neural networks (RNN).

Figure 5:
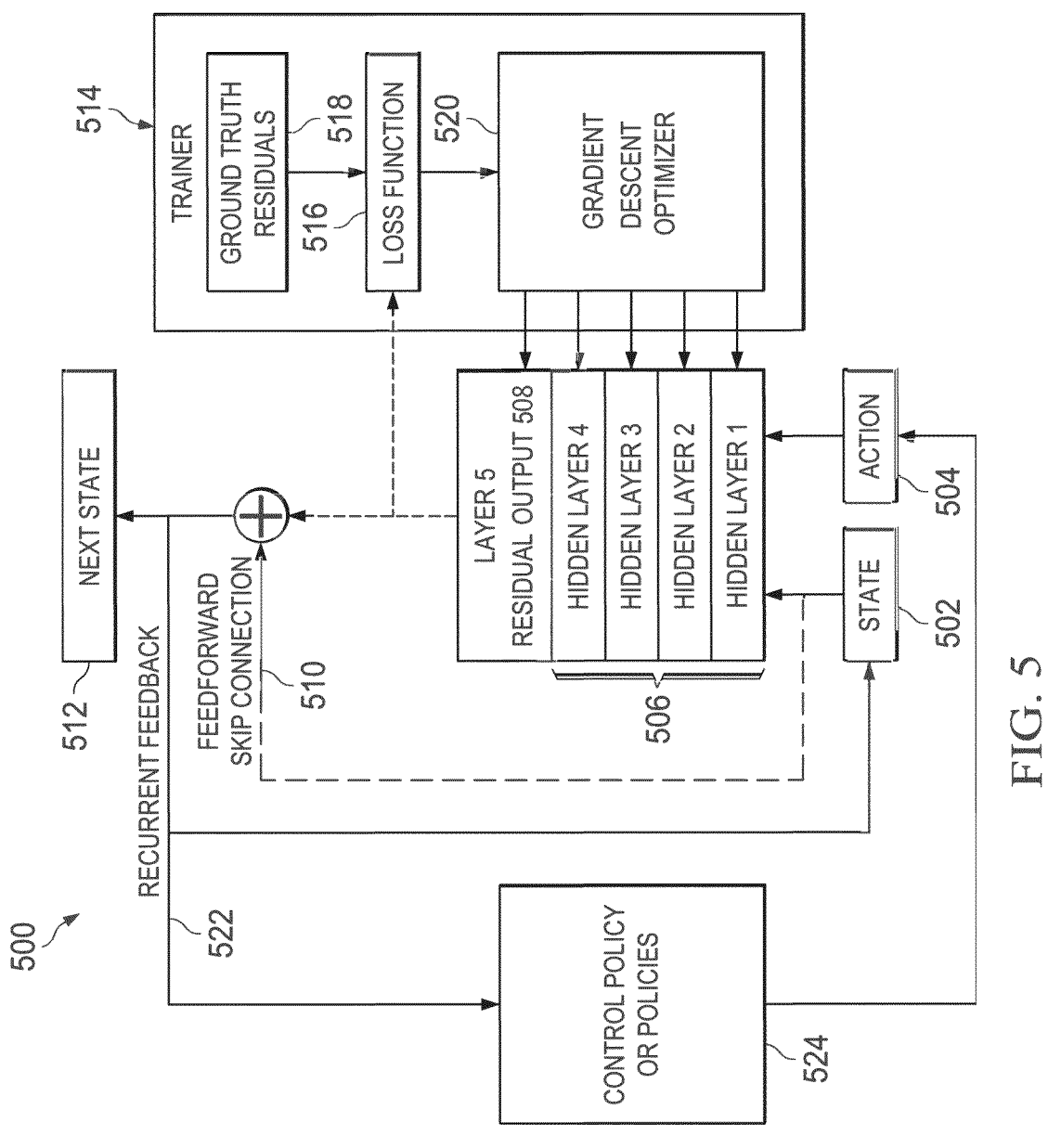
FIG. 5 depicts a diagram illustrating a neural network for a predictive model of aircraft trajectory in accordance with an illustrative embodiment.

FIG. 5 depicts a diagram illustrating a neural network for a predictive model of aircraft trajectory in accordance with an illustrative embodiment.

Model 500 uses the current observed state 502 of the aircraft as input and also interacts with one or more control policies 522 that provide actions for the aircraft (e.g., throttle, rudder, etc.). Model 500 uses a deep neural network to predict the state observation 512 in the next timestep and feeds it back to the current state observation input in similar fashion to that of a recurrent neural network (RNN). Model 500 also uses the control policies 522 to determine the action 504 that will be provided as plant input to the aircraft in the next timestep. This method allows for learning aircraft dynamics when a pre-existing model of the aircraft is either unavailable or is unsuitable for use in autonomous decision making. Rather than predicting the actions of an aircraft's control system or pilot, model 500 learns to predict how the aircraft responds to those control inputs.

Instead of predicting the next state directly, the neural network predicts the difference between the current state and the next state. This approach applies the residual method to the prediction of aircraft dynamics instead of its traditional use in computer vision tasks. Whereas residual skip connects are typically used with sparsely connected convolutional neural networks, model 500 employs a fully connected network. In traditional residual networks multiple skips connections are used, each bypassing only a small number of layers. In contrast, model 500 uses a single skip connection 510 that starts at some of the network inputs and ends at the network output, thereby bypassing all layers.

The loss function 516 is computed using the residual output 508 before summation with the skip connection 510 rather than after. In general, the residual change in the observed state from one timestep to the next is several orders of magnitude smaller that the state itself, because the state is the accumulation of residuals from hundreds or thousands of timesteps, plus an initial value that may be arbitrarily large. Because the residual output 508 and current state 502 have vastly different magnitudes, summing these vectors before applying the loss function 516 would prevent the optimizer 520 from accurately calculating the gradient. Performance improves dramatically when the residual output 508 is optimized for minimal mean square error loss with respect to ground truth residuals 518 computed by subtracting adjacent observations in the training data.

In an illustrative embodiment, the residual computation function implements a full connected neural network with a total of five layers. This configuration can be used to make predictions for an adversarial air engagement scenario with two aircraft, such as shown in FIG. 1. In one embodiment, there are eight state inputs (four for each aircraft). There are four action inputs (two for each aircraft). Each of the four hidden layers contains 64 nodes and applies a ReLU (Rectified Linear Unit) nonlinearity to the output. The final output layer comprises eight outputs (four for each aircraft).

The illustrative embodiments are able to model each of the aircraft separately. The illustrative embodiments are also able to model interactions between different aircraft (e.g., interactions involving weapons, sensors, and electronic warfare systems) with a single fully connection network to process all the observations.

Figure 6:
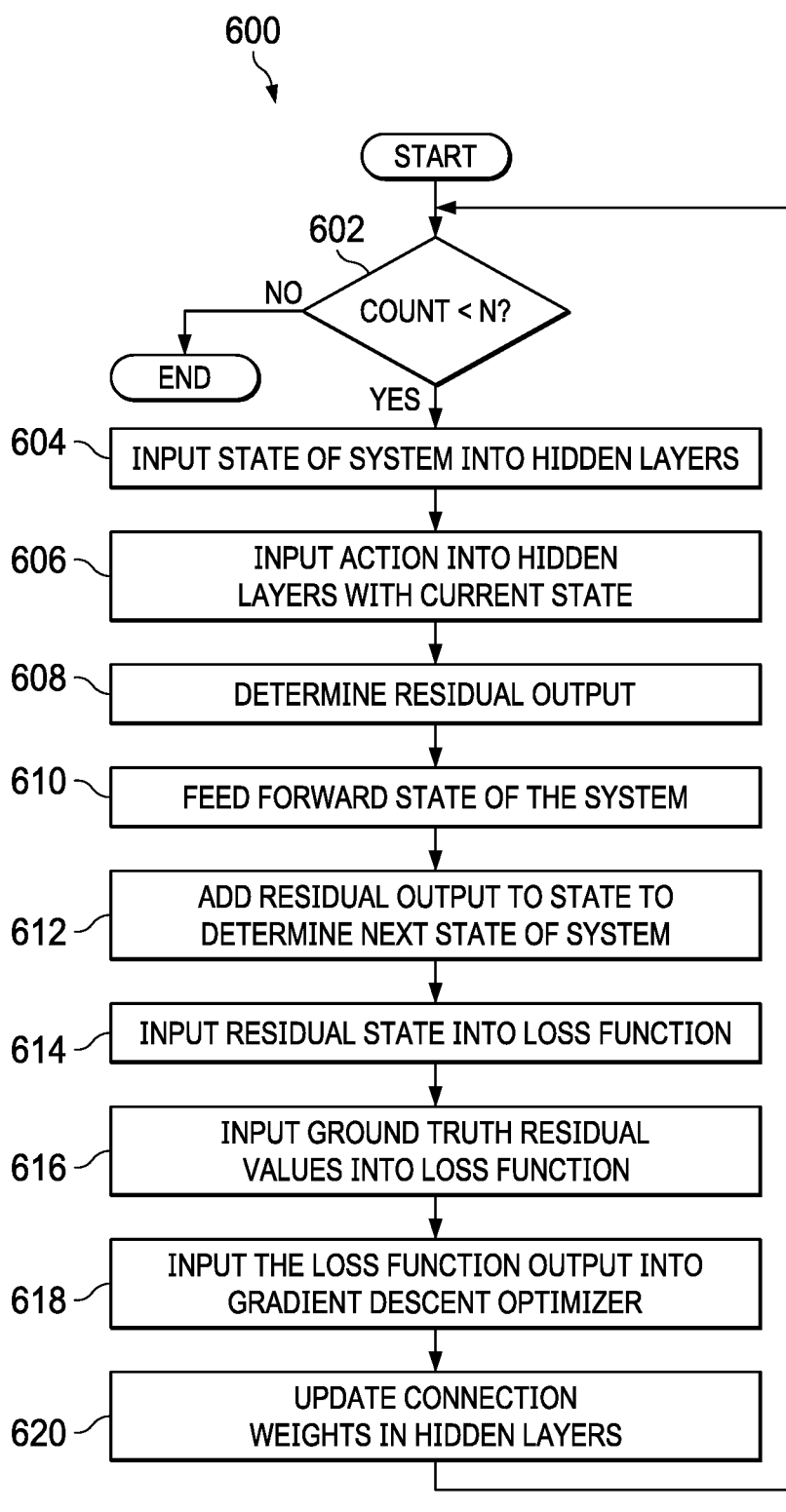
FIG. 6 depicts a flowchart illustrating the process of training a predictive model for aircraft trajectory in accordance with an illustrative embodiment.

FIG. 6 depicts a flowchart illustrating the process of training predictive model 500 in FIG. 5 in accordance with an illustrative embodiment. Process 600 can be implemented in hardware, software, or both. When implemented in software, the process can take the form of program code that is run by one or more processor units located in one or more hardware devices in one or more systems. Process 600 might be implemented in aircraft dynamics modeling system 200 in FIG. 2.

The model/network 500 is trained using supervised learning with a method such as stochastic batch gradient descent. Several episodes of trajectory data are collected from agent-environment interaction. In order to ensure good exploration of the action space, the collection process uses a random control policy that samples from the set of all possible actions using a uniform random distribution (although other policies can also be used with the illustrative embodiments).

Each episode contains N states and N–1 actions. For example, the shortest non-trivial episode may comprise a starting state, a single action, and an ending state. The data is pre-processed to create a training set wherein X comprises current states and actions, and Y comprises the residual difference between next states and current states. The network can be trained by beginning with a randomly initialized set of weight and biases and applying convex optimization updates that minimize a mean square error loss function that directly measures the residual before it is added to the skip connection.

Process 600 begins by determining if the state count of the aircraft is less than a specified maximum n (step 602). If the state count is less than the maximum, process 600 inputs a current state observation 502 of a number of aircraft into a number of hidden layers 506 of neural network 500 (step 604). Current state 502 may comprise, e.g., aircraft trajectory data. Current state 502 might comprise a heading angle. In an illustrative embodiment, neural network 500 is fully connected.

An action 504 applied to the aircraft is input into the hidden layers 506 concurrently with the current state 502 (step 606). Action 504 may be selected randomly from a set of possible actions according to a number of control policies 524 for a controller in an aircraft. Action 504 may be one-hot encoded for input into the hidden layers 506. Initially, each action may take a number of discrete (integer) values. After one-hot encoding, the input is converted to a vector of Boolean values. For example, if there are five possible actions and the second action is selected, the one-hot encoding is [0, 1, 0, 0, 0]. One-hot encoding may provide advantages as the number of possible actions (action space) becomes larger.

Based on the current state 502 and action 504, the hidden layers 506 determine a residual output 508 that comprises an incremental difference in the state of the aircraft resulting from the current action 504 (step 608).

A skip connection 510 feeds forward the current state 502 of the aircraft (step 610), and the residual output 508 is added to the current state 502 to determine the next state 512 of the aircraft (e.g., aircraft trajectory for the next timestep) (step 612).

When the observed state comprises a heading angle a modulo operation may be applied to the residual output after adding the residual output to the current state. The modulo operation ensures the angle changes within a specified range. Instead of simply adding the residual 508 to the skip connection 510, the following function is applied to the resulting angle in degrees:

$$f(x)=(x+180) \text{ modulo } 360-180 \qquad \text{Eq. 1}$$

This function ensures that the angle does not go outside the acceptable range of (−180, 180). The same function can be applied to the residual targets in Y (used during training)

that correspond to angular variables. Without the modulo function, the residual values might become very large in certain pathological cases. For example, if an aircraft's heading angle changes just three degrees from 179 degree to −178 degree, the residual would otherwise come out to:

$$-178-179=-357$$

which is intuitively too large to be considered a residual. By applying Equation 1, the residual value is brought back down to a reasonable and intuitive value of three.

For non-angular observations, next state 512 may be clamped to ensure the next state is within predefined maximum and minimum values so that it never goes outside the range encountered during training. For example, if the aircraft encountered during training always fly at a velocity between 100 m/s and 400 m/s, but the neural network tries to predict a decrease or increase in velocity beyond these minimum and maximum values, the output is clamped at 100 m/s or 400 m/s, respectively. This clamping may improve generalization in the event that a control policy encountered during evaluation tries to push the aircraft outside its normal operating characteristics.

The residual output 508 is input into a loss function 516 in trainer 514 (step 614). A number of ground truth residual values 518 are also input into the loss function 516 concurrently with the residual output 508 (step 616). The output from the loss function 516 is input into a gradient descent optimizer 520 that computes gradients for the hidden layers 506 (step 618), and connection weights in the hidden layers 506 are updated according to the computed gradients (step 620).

Process 600 then returns to step 602. If the state count is still less than the specific maximum n, the next state 512 is fed into the hidden layers 506 through recurrent feedback 522 along with a new action, and the steps are repeated. If the state count has reached the specified maximum, process 600 ends.

Figure 7:
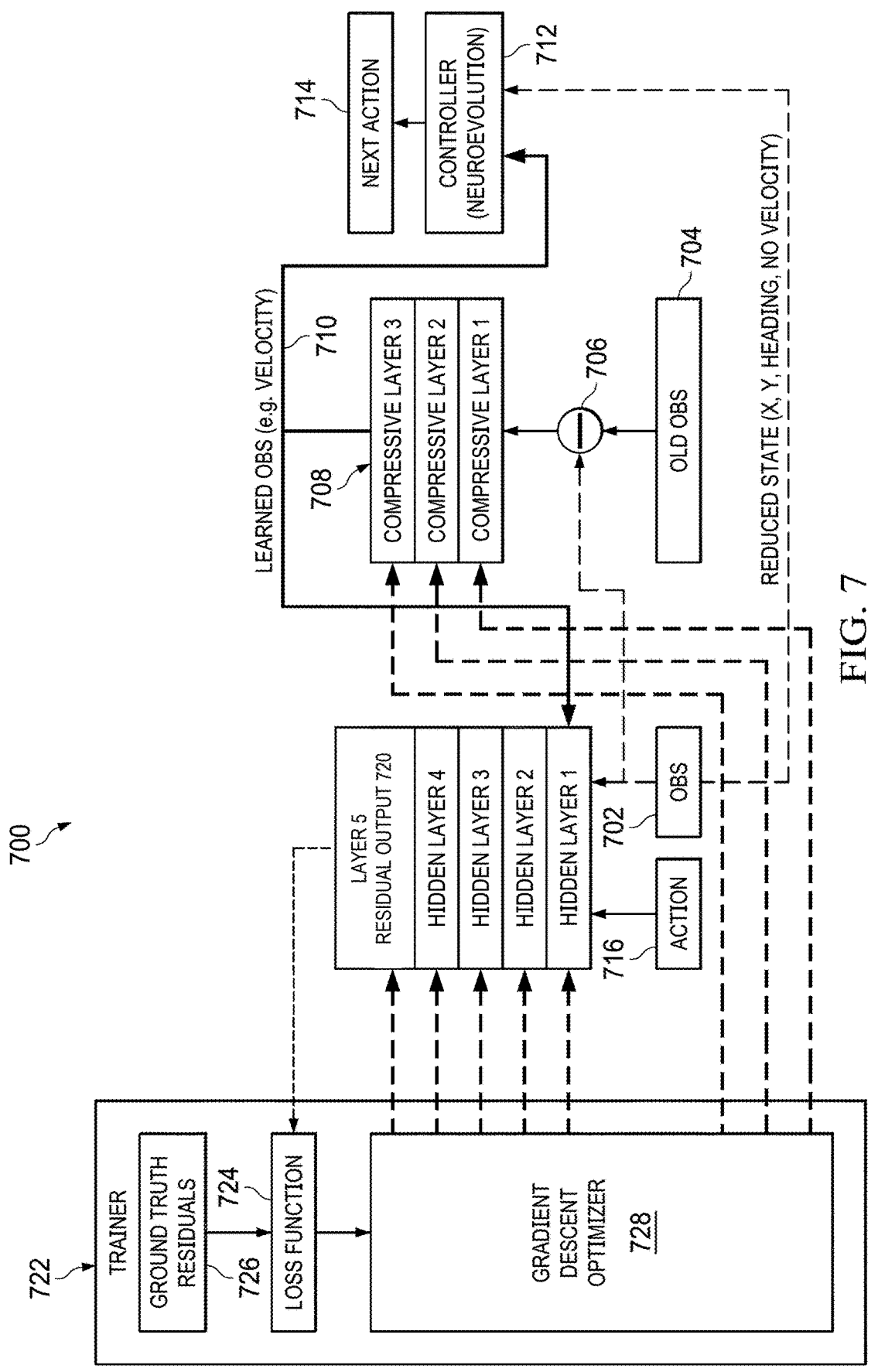
FIG. 7 depicts a diagram illustrating a neural network for training a compressive encoder for user with an aircraft controller in accordance with an illustrative embodiment.

FIG. 7 depicts a diagram illustrating a neural network for training a compressive encoder for use with an aircraft controller in accordance with an illustrative embodiment.

In addition to the current state, neural network 700 also uses the previous observed state 704. Network 700 computes difference 706 between current 702 and past observed states 704 in the same way that sequential observations are subtracted to produce the label values for supervised learning. Difference 706 is fed to compressive layers 708. Compressive layers 708 have fewer outputs than inputs. Since there is no other path from the previous observation to the output of the full network, the compressive layers 708 learn to encode as much useful information as it can from the previous observation that is not incorporated in the current observation (i.e., missing parameter values/"hidden" observations).

This process is similar to the operating principle of an autoencoder, except that it encodes information needed to make future predictions instead of simply recovering an output that matches the input. In an embodiment, the compressive encoder comprises three layers, each with a ReLU activation. The first two layers have 64 neurons each, and the last one contains two neurons.

FIG. 8 depicts a flowchart illustrating the process of training a compressive encoder for use with an aircraft controller in accordance with an illustrative embodiment. Neural network 700 and process 800 can be implemented in hardware, software, or both. When implemented in software, the process can take the form of program code that is run by one or more processor units located in one or more hardware devices in one or more systems. Neural network 700 and process 800 might be implemented in aircraft dynamics modeling system 200 in FIG. 2.

Process 800 begins by determining if the state count of the aircraft is less than a specified maximum n (step 802). If the state count is less than the maximum, process 800 calculates a difference 706 between a current state 702, respectively of each, of a number of aircraft and a previous state 704, respectively of each, of the number of aircraft (step 804). The current state comprises a reduced state in which a value of a specified parameter is missing, e.g., the heading of an aircraft is known, but the velocity is not.

The difference 706 is input into a number of compressive layers 708 of a neural network comprising an encoder (step 806). Based on the difference between the observed current state 702 and past observed state 704, the compressive layers learn the value for the missing parameter (e.g., velocity) (step 808).

The current state 702 is then input into a number of hidden layers 718 of a fully connected neural network comprising a decoder (step 810). The learned value 710 is fed into the hidden layers 718 concurrently with the current state 702 (step 812). A current action 716 applied to the aircraft is also fed into the hidden layers 718 concurrently with the current state 702 and learned value 710 (step 814). Action 716 may be one-hot encoded for input into the hidden layers 718.

From the current state 702, learned value 710, and current action 716, the hidden layers 718 determine a residual output 720 that comprises an incremental difference in the state of the aircraft resulting from the current action 716 (step 816).

The residual output 720 is input into a loss function 724 in trainer 722 (step 818). A number of ground truth residual values 726 are also input into the loss function 724 concurrently with the residual output 720 (step 820). The output from the loss function 724 is input into a gradient descent optimizer 728 that computes gradients for the compressive layers 708 and hidden layers 718 (step 822), and connection weights in the compressive layers 708 and hidden layers 718 are updated according to the computed gradients (step 824).

Process 800 then returns to step 802. If the state count is still less than the specific maximum n, the steps are repeated. If the state count has reached the specified maximum, process 800 ends.

Figure 9:
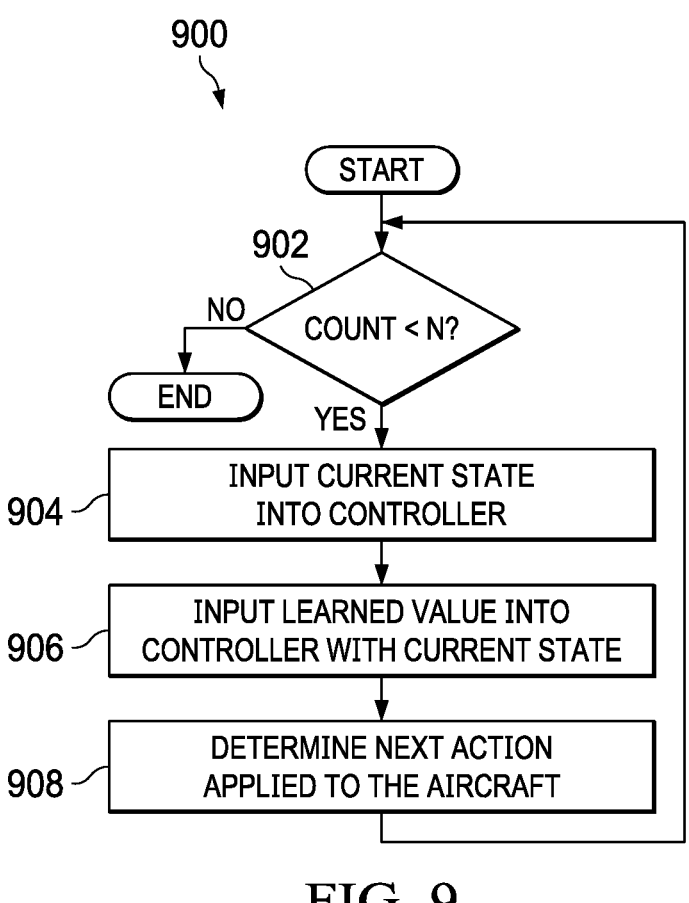
FIG. 9 depicts a flowchart illustrating a process for validating an encoder with an aircraft controller in accordance with an illustrative embodiment.

FIG. 9 depicts a flowchart illustrating a process for validating an encoder with an aircraft controller in accordance with an illustrative embodiment. Process 900 can be applied after the encoder in neural network 800 has been trained.

Process 900 begins by determining if the state count of the aircraft is less than a specified maximum n (step 902). If the state count is less than the maximum, the current state 702 is fed into a neural network controller 712 (step 904). The learned value 710 is fed into the controller 712 concurrently with the current state 702 (step 906). The controller 712 then determines a next action 714 to be applied to the aircraft according to the current state 702 and learned value 710 (step 908).

Process 900 then returns to step 902. If the state count is still less than the specific maximum n, the steps are repeated. If the state count has reached the specified maximum, process 900 ends.

Figure 10:
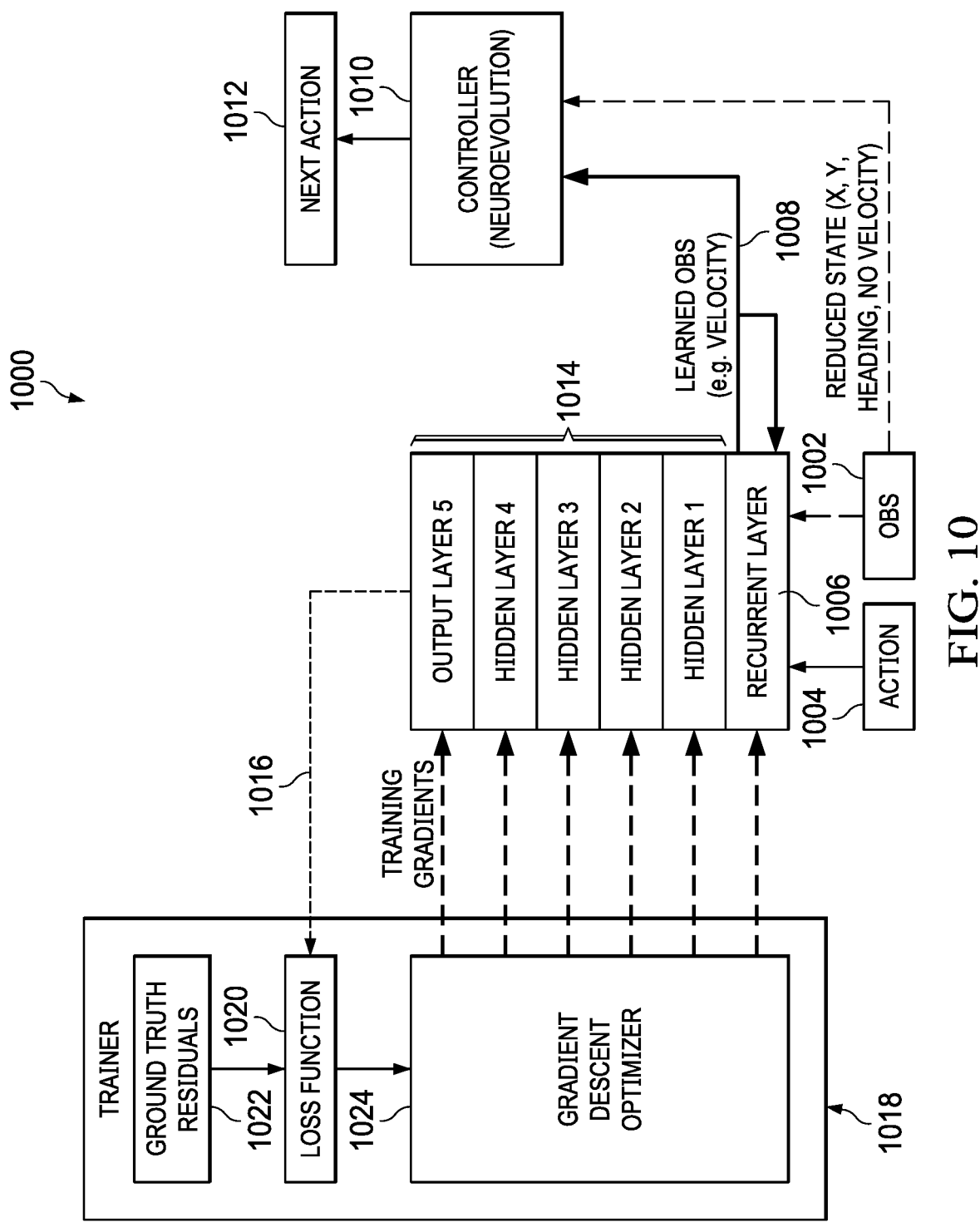
FIG. 10 depicts a diagram illustrating an alternate neural network for training an encoder for use with an aircraft controller in accordance with an illustrative embodiment.

FIG. 10 depicts a diagram illustrating an alternate neural network for training an encoder for use with an aircraft controller in accordance with an illustrative embodiment.

The architecture of neural network 1000 is able to extract information from all previous observed states, not just the one before the current observation. This architecture might be advantageous whenever missing information from partial observations cannot be captured by the first derivative of the observation.

FIG. 11 depicts a flowchart illustrating an alternate process of training an encoder for use with an aircraft controller in accordance with an illustrative embodiment. Neural network 1000 and process 1100 can be implemented in hardware, software, or both. When implemented in software, the process can take the form of program code that is run by one or more processor units located in one or more hardware devices in one or more systems. Neural network 1000 and process 1100 might be implemented in aircraft dynamics modeling system 200 in FIG. 2.

Process 1100 begins by determining if the state count of the aircraft is less than a specified maximum n (step 1102). If the state count is less than the maximum, process 1100 inputs a current observed state 1002 of a number of aircraft into a recurrent layer 1006 of the neural network (step 1104). The current state 1002 comprises a reduced state in which a value of a specified parameter (e.g., velocity) is missing. An action 1004 applied to the aircraft is also input into the recurrent layer 1006 concurrently with the current state 1002 (step 1106). Action 1004 may be one-hot encoded for input into recurrent layer 1006. From these inputs, the recurrent layer 1006 learns a value 1008 for the parameter missing from current state 1002 (step 1108).

The output of the recurrent layer 1006 is fed into a number of fully connected hidden layers 1014 (step 1110). Based on the current observed state 1002, learned value 1008, and action 1004, the hidden layers 1014 determine a residual output 1016 that comprises an incremental difference in the state of the aircraft resulting from the action 1004 (step 1112).

The residual output 1016 is input into a loss function 1020 in trainer 1018 (step 1114). A number of ground truth residual values 1022 are also input into the loss function 1020 concurrently with the residual output 1016 (step 1116). The output from the loss function 1020 is input into a gradient descent optimizer 1024 that computes gradients for the recurrent layer 1006 and hidden layers 1014 (step 1118), and connection weights in the recurrent layer 1006 and hidden layers 1014 are updated according to the computed gradients (step 1120).

Process 1100 then returns to step 1102. If the state count is still less than the specific maximum n, the steps are repeated. If the state count has reached the specified maximum, process 1100 ends.

Process 900 may also be applied to neural network 1000 after the encoder has been trained. The learned value 1008 is input from the recurrent layer 1006 to neural network controller 1010 along with a current observed state 1002. Based on these inputs, the controller 1010 then determines the next action 1012 applied to the aircraft.

Figure 12:
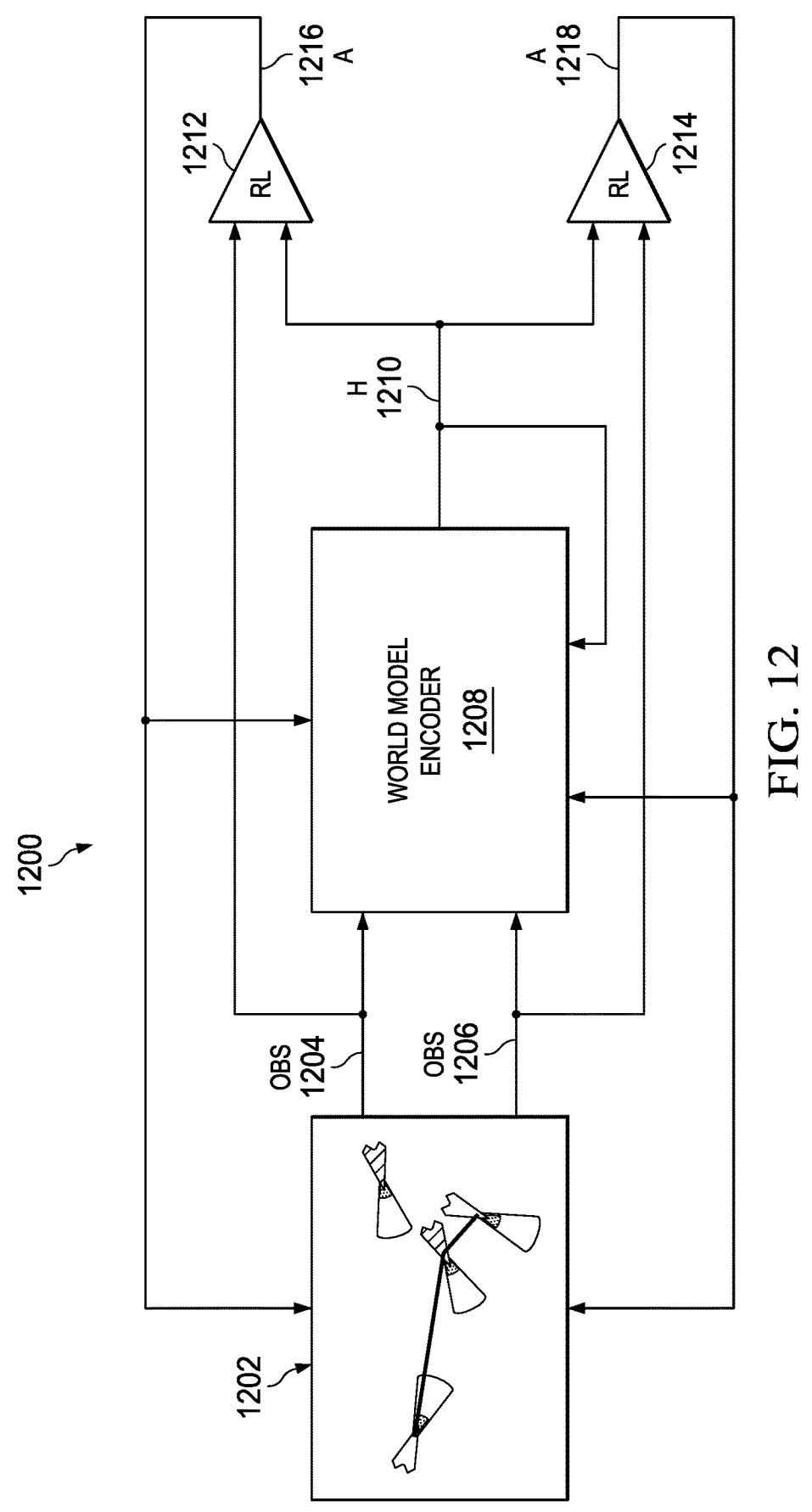
FIG. 12 depicts a diagram illustrating a system for training adversarial aircraft controllers in accordance with an illustrative embodiment.

FIG. 12 depicts a diagram illustrating a system for training adversarial aircraft controllers in accordance with an illustrative embodiment.

After state representation learning has been performed, the resulting neural network may be used to produce compact state vectors that are provided to a neural network controller (e.g., a neuroevolution controller). This approach is known in the art as the World Models framework. In the illustrative embodiments, the world model learns aircraft dynamics and also learns a compact state representation, using either a compressive encoder or a more traditional recurrent neural network (RNN).

In the present example, the compressed output is labeled "H" 1210. The illustrative embodiments extend the World Models approach by providing separate controllers 1212, 1214 for each of the adversarial aircraft/teams but provide the environment's encoded state to both controllers. The reinforcement learning controllers can learn using gradient-based methods or evolutionary methods.

In an embodiment, the neuroevolution is used to select actions based on the encoded historical observation and current partial observation. The simulations uses an action space for each aircraft that may comprise, e.g., {pursue opponent, evade opponent, fire weapon, support weapon, fly straight}. The environment provides a partial observation space, which includes the relative positions of the two aircraft but does not include their relative velocities. The neural network controllers have fixed topology and evolved weights. The controllers take in the partial observations and the compressed encoding of the previous observation and select one of the available actions. In an embodiment, the neural network controllers 1212, 1214 each comprise one hidden layer with 36 nodes and ReLU activation and an output layer with five nodes.

FIG. 13 depicts a flowchart illustrating a process of training adversarial aircraft controllers in accordance with an illustrative embodiment.

Process 1300 begins by determining if the state count of the aircraft is less than a specified maximum n (step 1302). If the state count is less than the maximum, process 1300 inputs a number of current observed states 1204, 1206 of aircraft 1202 into a world model encoder 1208 (step 1304), each current observed state 1204, 1206 representing a different aircraft. Each current state 1204, 1206 may comprise a missing parameter value (e.g., velocity).

A number of adversarial control actions 1216, 1218 for the aircraft are also input into the world model encoder 1208 concurrently with the current observed state (step 1308). The adversarial control actions 1216, 1218 are generated by competing neural network controllers 1212, 1214.

The world model encoder 1208 generates a learned (hidden) observation h 1210 from the current observed states 1204, 1206 and adversarial control actions 1216, 1218 (step 1308). The learned observation h 1210 represents the parameter value missing from the current observed states 1204, 1206.

The learned observation h 1210 and current observed states 1204, 1206 are input into the competing neural network controllers 1212, 1214 (step 1310). Each current observed state 1204, 1206 is fed into a respective neural network controller 1212, 1214 corresponding to an aircraft represented by the current observed state. The competing neural network controllers 1212, 1214 then generate next adversarial control actions (step 1312).

Process 1300 then returns to step 1302. If the state count is still less than the specific maximum n, the steps are repeated. If the state count has reached the specified maximum, process 1300 ends.

Figure 14:
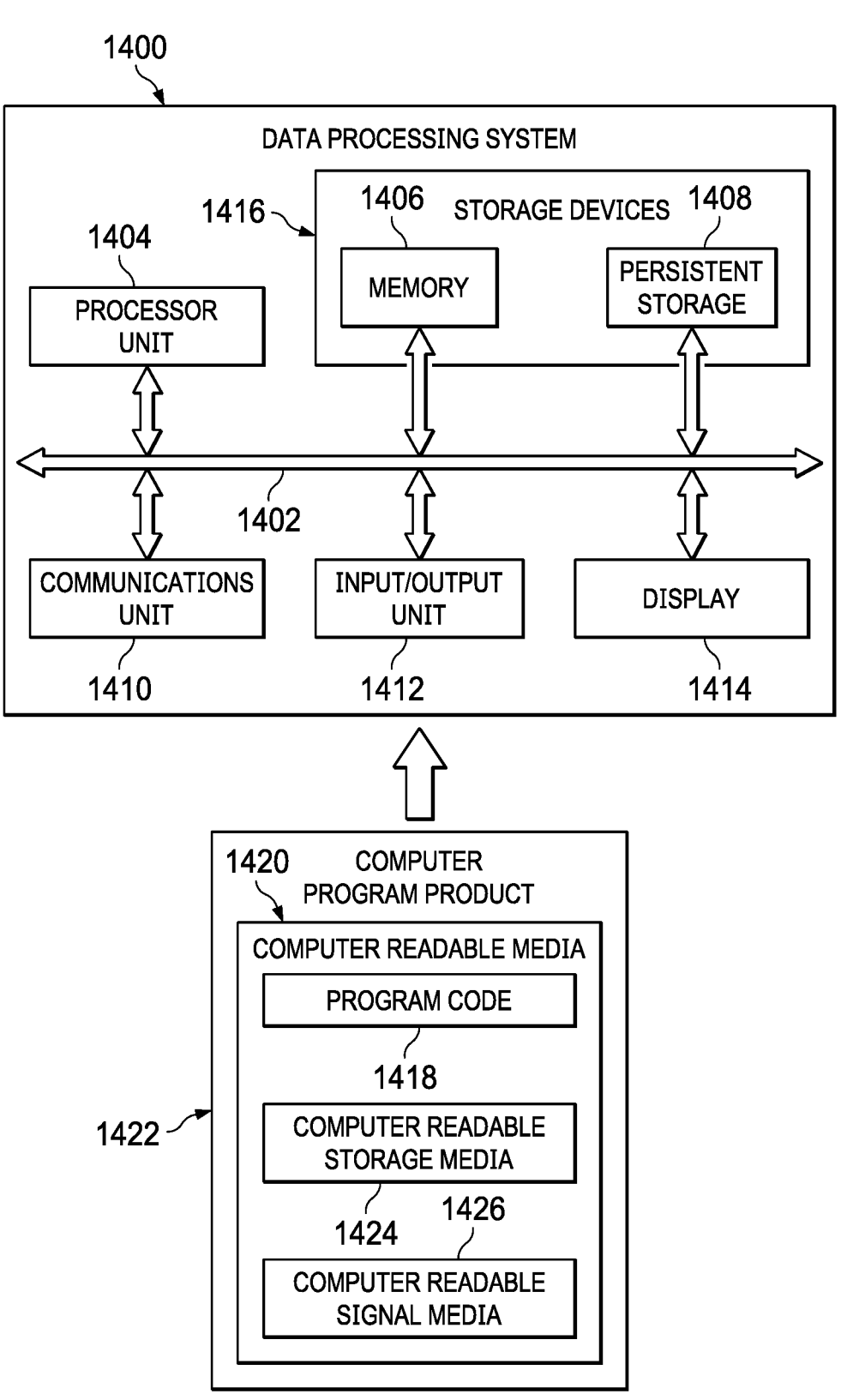
FIG. 14 depicts a block diagram of a data processing system in accordance with an illustrative embodiment.

Turning now to FIG. 14, an illustration of a block diagram of a data processing system is depicted in accordance with an illustrative embodiment. Data processing system might be an example of computer system 250 in FIG. 2. Data processing system 1400 might be used to implement one or more computers to carry out process steps shown in FIGS. 5-13. In this illustrative example, data processing system 1400 includes communications framework 1402, which provides communications between processor unit 1404, memory 1406, persistent storage 1408, communications unit 1410, input/output unit 1412, and display 1414. In this example, communications framework 1402 may take the form of a bus system.

Processor unit 1404 serves to execute instructions for software that may be loaded into memory 1406. Processor unit 1404 may be a number of processors, a multi-processor core, or some other type of processor, depending on the particular implementation. In an embodiment, processor unit 1404 comprises one or more conventional general-purpose central processing units (CPUs). In an alternate embodiment, processor unit 1404 comprises a number of graphical processing units (GPUs).

Memory 1406 and persistent storage 1408 are examples of storage devices 1416. A storage device is any piece of hardware that is capable of storing information, such as, for example, without limitation, at least one of data, program code in functional form, or other suitable information either on a temporary basis, a permanent basis, or both on a temporary basis and a permanent basis. Storage devices 1416 may also be referred to as computer-readable storage devices in these illustrative examples. Memory 1406, in these examples, may be, for example, a random access memory or any other suitable volatile or non-volatile storage device. Persistent storage 1408 may take various forms, depending on the particular implementation.

For example, persistent storage 1408 may contain one or more components or devices. For example, persistent storage 1408 may be a hard drive, a flash memory, a rewritable optical disk, a rewritable magnetic tape, or some combination of the above. The media used by persistent storage 1408 also may be removable. For example, a removable hard drive may be used for persistent storage 1408. Communications unit 1410, in these illustrative examples, provides for communications with other data processing systems or devices. In these illustrative examples, communications unit 1410 is a network interface card.

Input/output unit 1412 allows for input and output of data with other devices that may be connected to data processing system 1400. For example, input/output unit 1412 may provide a connection for user input through at least one of a keyboard, a mouse, or some other suitable input device. Further, input/output unit 1412 may send output to a printer. Display 1414 provides a mechanism to display information to a user.

Instructions for at least one of the operating system, applications, or programs may be located in storage devices 1416, which are in communication with processor unit 1404 through communications framework 1402. The processes of the different embodiments may be performed by processor unit 1404 using computer-implemented instructions, which may be located in a memory, such as memory 1406.

These instructions are referred to as program code, computer-usable program code, or computer-readable program code that may be read and executed by a processor in processor unit 1404. The program code in the different embodiments may be embodied on different physical or computer-readable storage media, such as memory 1406 or persistent storage 1408.

Program code 1418 is located in a functional form on computer-readable media 1420 that is selectively removable and may be loaded onto or transferred to data processing system 1400 for execution by processor unit 1404. Program code 1418 and computer-readable media 1420 form computer program product 1422 in these illustrative examples. Computer program product 1422 might be for aligning reference frames for an augmented reality (AR) display. In one example, computer-readable media 1420 may be computer-readable storage media 1424 or computer-readable signal media 1426.

In these illustrative examples, computer-readable storage media 1424 is a physical or tangible storage device used to store program code 1418 rather than a medium that propagates or transmits program code 1418. Alternatively, program code 1418 may be transferred to data processing system 1400 using computer-readable signal media 1426.

Computer-readable signal media 1426 may be, for example, a propagated data signal containing program code 1418. For example, computer-readable signal media 1426 may be at least one of an electromagnetic signal, an optical signal, or any other suitable type of signal. These signals may be transmitted over at least one of communications links, such as wireless communications links, optical fiber cable, coaxial cable, a wire, or any other suitable type of communications link.

The different components illustrated for data processing system 1400 are not meant to provide architectural limitations to the manner in which different embodiments may be implemented. The different illustrative embodiments may be implemented in a data processing system including components in addition to or in place of those illustrated for data processing system 1400. Other components shown in FIG. 14 can be varied from the illustrative examples shown. The different embodiments may be implemented using any hardware device or system capable of running program code 1418.

As used herein, a first component "connected to" a second component means that the first component can be connected directly or indirectly to the second component. In other words, additional components may be present between the first component and the second component. The first component is considered to be indirectly connected to the second component when one or more additional components are present between the two components. When the first component is directly connected to the second component, no additional components are present between the two components.

As used herein, the phrase "a number" means one or more. The phrase "at least one of", when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

For example, without limitation, "at least one of item A, item B, or item C" may include item A, item A and item B, or item C. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step. For example, one or more of the blocks may be implemented as program code.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

The description of the different illustrative embodiments has been presented for purposes of illustration and description and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for learning aircraft dynamics when a pre-existing model of at least one of a number of aircraft, in a sensor cone of an aircraft that comprises a sensor, is either unavailable or is unsuitable for use in autonomous decision making and predicting behavior of the number of aircraft in the sensor cone, the method comprising using a number of processors performing the steps of:

training a neural network;

applying, for any numerical conditioning challenges encountered during training, a loss function only to a residual output, excluding a skip connection;

subsequently inputting a current state, respectively, of the number of aircraft in the sensor cone into a number of hidden layers of the neural network, wherein the neural network is fully connected and comprises a feedforward skip connection from the current state, respectively, of the number of aircraft in the sensor cone to all outputs of the neural network;

inputting an action applied to the aircraft that comprises the sensor into the hidden layers concurrently with the current state;

determining, by the hidden layers according to the current state and current action, residual output that comprises an incremental difference in the current state of the aircraft that comprises the sensor resulting from the current action;

feeding forward, by the skip connection, the current state of the aircraft that comprises the sensor to all outputs of the neural network;

adding the residual output to the current state to determine a next state of the aircraft that comprises the sensor, wherein the next state defines a trajectory for the aircraft for a next timestep; and controlling a next action of the aircraft that comprises the sensor with a controller using the next state.

2. The method of claim 1, further comprising:

sensing, through a sensor system of the aircraft that comprises the sensor, parameters of the number of aircraft in the sensor cone of the aircraft that comprises the sensor indicating the current state respectively for each of the number of aircraft in the sensor cone;

inputting the residual output into a loss function;

inputting a number of ground truth residual values into the loss function concurrently with the residual output;

inputting an output from the loss function into a gradient descent optimizer that computes gradients for the hidden layers; and updating connection weights in the hidden layers according to the gradients.

3. The method of claim 1, wherein the action is selected randomly from a set of possible actions according to a number of control policies for a controller.

4. The method of claim 1, wherein the neural network models the behavior of the number of aircraft.

5. The method of claim 1, wherein the current state and next state comprise trajectory data.

6. The method of claim 1, wherein the current state and next state comprise a heading angle.

7. The method of claim 6, further comprising applying a modulo operation to the residual output after adding the residual output to the current state, wherein the modulo operation ensures the heading angle changes within a specified range.

8. The method of claim 1, further comprising clamping the next state to ensure the next state is within predefined maximum and minimum values.

9. The method of claim 1, wherein the action is one-hot encoded for input into the hidden layers.

10. A system configured to predict behavior of a number of aircraft, wherein the system comprises:

a sensor, on an aircraft that comprises a sensor cone, configured to sense parameters that indicate a current state, respectively, for each of a number of aircraft in the sensor cone;

a controller;

a storage device configured to store program instructions; and one or more processors operably connected to the storage device and configured to execute the program instructions to cause the system to:

train a neural network;

apply, for any numerical conditioning challenges encountered during training, a loss function only to a residual output, excluding a skip connection;

subsequently input a current state, respectively, of the number of aircraft in the sensor cone into a number of hidden layers of the neural network, wherein the neural network is fully connected and comprises a feedforward skip connection from the current state of the number of aircraft in the sensor cone to all outputs of the neural network;

input an action applied to the aircraft that comprises the sensor into the hidden layers concurrently with the current state;

determine, by the hidden layers according to the current state and current action, a residual output that comprises an incremental difference in the current state of the aircraft that comprises the sensor resulting from the current action;

feed forward, by the skip connection, the current state of the aircraft that comprises the sensor to all outputs of the neural network;

add the residual output to the current state to determine a next state of the aircraft that comprises the sensor, wherein the next state defines a trajectory for the aircraft that comprises the sensor for a next timestep; and control, based upon the next state, a next action of the aircraft that comprises the sensor with the controller.

11. The system of claim 10, wherein the system further comprises:

a sensor that comprises a sensor cone configured to sense parameters that indicate a current state, respectively, for each of a number of aircraft in the sensor cone; and the processors configured to execute program instructions to:

input the residual output into a loss function;

input a number of ground truth residual values into the loss function concurrently with the residual output;

input an output from the loss function into a gradient descent optimizer that computes gradients for the hidden layers; and update connection weights in the hidden layers according to the gradients.

12. The system of claim 10, wherein the action is selected randomly from a set of possible actions according to a number of control policies for a controller.

13. The system of claim 10, wherein the current state and next state comprise at least one of:

trajectory data; or a heading angle.

14. The system of claim 10, further comprising clamping the next state to ensure the next state is within predefined maximum and minimum values.

15. A computer program product configured to predict behavior of a number of aircraft, wherein the computer program product comprises a controller configured to determine a next action of an aircraft that comprises a sensor, wherein the sensor comprises a sensor cone, and a computer-readable storage medium that comprises program instructions configured to:

receive, from the sensor, parameters that indicate a current state, respectively, for each of the number of aircraft in the sensor cone;

train a neural network;

apply, for any numerical conditioning challenges encountered during training, a loss function only to a residual output, excluding a skip connection;

subsequently input the current state of the number of aircraft in the sensor cone into a number of hidden layers of the neural network, wherein the neural network is fully connected and comprises a feedforward skip connection from the current state of the number of aircraft in the sensor cone to all outputs of the neural network;

input an action applied to the aircraft that comprises the sensor into the hidden layers concurrently with the current state;

determine, by the hidden layers according to the current state and current action, a residual output that comprises an incremental difference in a state of the aircraft that comprises the sensor resultant from the current action;

feed forward, by a skip connection, the current state of the aircraft that comprises the sensor to all outputs of the neural network;

add the residual output to the current state to determine a next state of the aircraft that comprises the sensor, wherein the next state defines a trajectory for the aircraft for a next timestep; and control, with the controller and based upon the next state, a next action of the aircraft that comprises the sensor.

16. The computer program product of claim 15, further comprising:

inputting the residual output into a loss function;

inputting a number of ground truth residual values into the loss function concurrently with the residual output;

inputting an output from the loss function into a gradient descent optimizer that computes gradients for the hidden layers; and updating connection weights in the hidden layers according to the gradients.

17. The computer program product of claim 15, wherein the action is selected randomly from a set of possible actions according to a number of control policies for a controller.

18. The computer program product of claim 15, wherein the current state and next state comprise at least one of:

trajectory data; or a heading angle.

19. The computer program product of claim 18, further comprising applying, for the heading angle, a modulo operation to the residual output after adding the residual output to the current state, wherein the modulo operation ensures the heading angle changes within a specified range.

20. The computer program product of claim 15, further comprising clamping the next state to ensure the next state is within predefined maximum and minimum values.

\* \* \* \* \*